United States Patent [19]
Wiman et al.

[11] Patent Number: 5,772,366
[45] Date of Patent: Jun. 30, 1998

[54] DIAMOND COATED BODY

[75] Inventors: Jörgen Wiman, Sandviken; Ingrid Reineck, Huddinge, both of Sweden

[73] Assignee: Sandvik AB, Sandviken, Sweden

[21] Appl. No.: 853,869

[22] Filed: May 9, 1997

Related U.S. Application Data

[63] Continuation of Ser. No. 401,123, Mar. 9, 1995, abandoned.

[30]     Foreign Application Priority Data

Mar. 18, 1994 [SE] Sweden ................................. 9400909

[51] Int. Cl.$^6$ ............................ B23B 27/20; B23B 27/22
[52] U.S. Cl. ........................................... 407/119; 407/114
[58] Field of Search ............................ 407/113–116, 119

[56]                 References Cited

U.S. PATENT DOCUMENTS

| | | | |
|---|---|---|---|
| 3,947,937 | 4/1976 | Hertel | 407/114 |
| 4,087,192 | 5/1978 | Hertel | 407/114 |
| 4,734,339 | 3/1988 | Schachner et al. | . |
| 4,801,224 | 1/1989 | Pettersson et al. | . |
| 4,844,688 | 7/1989 | Clough et al. | . |
| 4,884,476 | 12/1989 | Okuzumi et al. | 407/118 |
| 5,044,839 | 9/1991 | Takahashi | 407/117 |
| 5,068,148 | 11/1991 | Nakahara et al. | 407/119 |
| 5,139,372 | 8/1992 | Tanabe et al. | 407/118 |
| 5,180,258 | 1/1993 | Bernadic | 407/117 |
| 5,192,171 | 3/1993 | Ther et al. | 407/116 |
| 5,193,947 | 3/1993 | Bernadic et al. | 407/116 |
| 5,225,275 | 7/1993 | Aida | 407/119 |
| 5,375,948 | 12/1994 | Lindstedt | 407/116 |
| 5,543,210 | 8/1996 | Kullander et al. | 407/119 |
| 5,585,176 | 12/1996 | Grab et al. | 428/336 |
| 5,618,625 | 4/1997 | Okamura | 407/119 |
| 5,648,119 | 7/1997 | Grab et al. | 407/119 |

FOREIGN PATENT DOCUMENTS

| | | |
|---|---|---|
| US91/05630 | 7/1992 | WIPO . |
| WO 95/12009 | 10/1994 | WIPO . |

OTHER PUBLICATIONS

Advanced Cutting Tool Materials, (Kenametal, 1988) pp. 77, 79 & 83.
Patent Abstracts of Japan, vol. 12, No. 343, M–741, abstract of JP, A, 63–102801 (Idemitsu Petrochem Co. Ltd.), 7 May 1988.
Patent Abstracts of Japan, vol. 10, No. 62, M–460, abstract of JP, A, 60–207703 (Mitsubishi Kinzoku K.K.), 19 Oct. 1985.
Patent Abstracts of Japan, vol. 13, No. 237, M–833, abstract of JP, A, 1–51203 (Sumitomo Electric Ind./ Ltd.), 27 Feb. 1989.

*Primary Examiner*—Steven C. Bishop
*Attorney, Agent, or Firm*—Burns, Doane, Swecker & Mathis, L.L.P.

[57]              ABSTRACT

The presently claimed invention discloses a compound body of a wear resistant substrate with a surface coating, which body is suitable for wear parts and tools applications. The body includes top and bottom surfaces and at least one peripheral wall extending therebetween, the intersection of said peripheral wall and at least said top surface forming a cutting edge. The surface coating on said body is a diamond coating of a thickness of 1–30 μm deposited directly from the gas phase in a reactor by CVD or PVD technique in a manner so as to ensure rigid bonding to said carbide substrate. The top face is provided with an integral chipformer so as to provide chips formed during machining into a desired and controllable configuration.

5 Claims, 2 Drawing Sheets

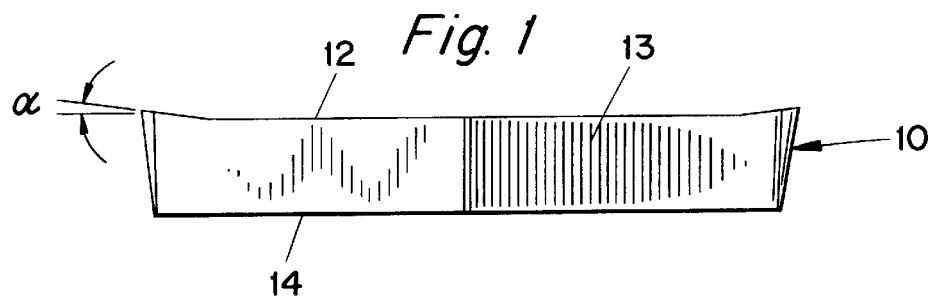
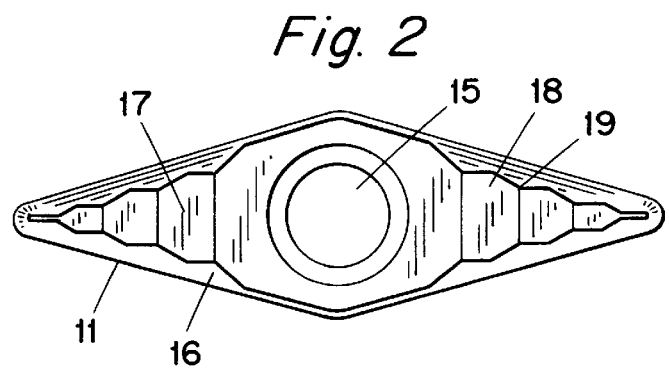
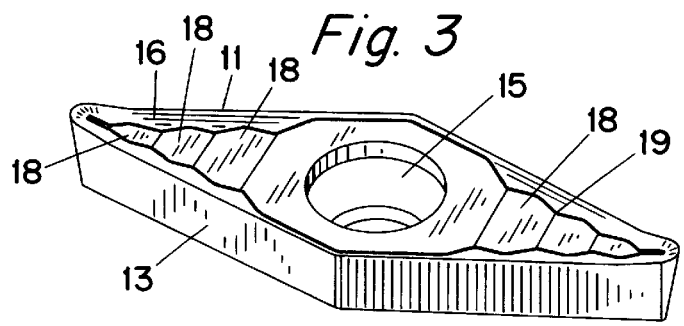
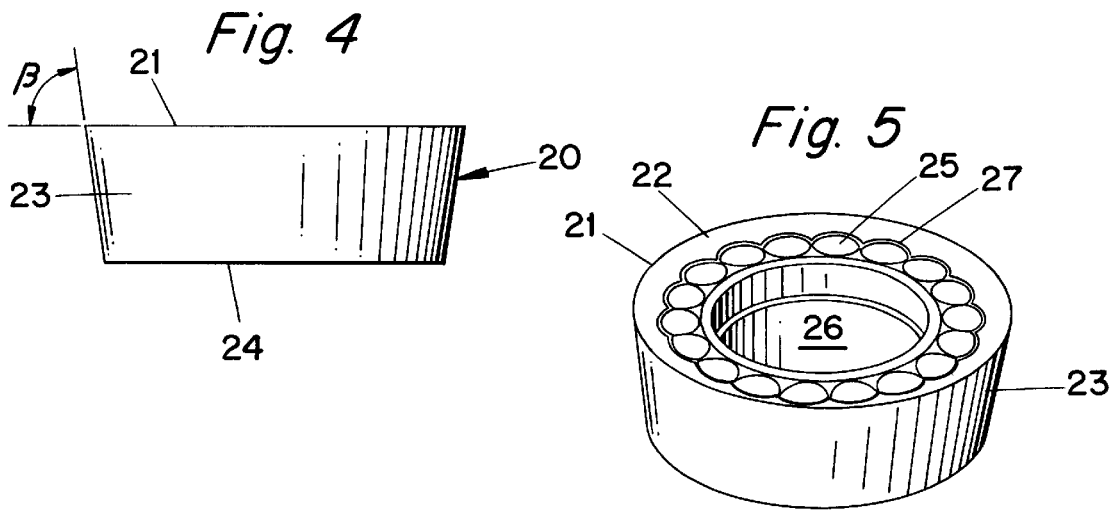

DIAMOND COATED BODY

This application is a continuation of application Ser. No. 08/401,123, filed Mar. 9, 1995, now abandoned.

BACKGROUND OF THE INVENTION

The present invention relates to a diamond coated cutting tool having an integral chip control surface, aimed for cutting Al-alloys containing, e.g., Si and Cu as alloying elements and the like.

Production of thin coatings of diamond directly from the gas phase by CVD or PVD technique is of great interest for coating of cutting tools, drill bits, knives, etc. A number of methods for diamond coating from gas phase have been described, including hot filament, microwave plasma, arc discharge plasma, gas flame, hollow cathode and different forms of plasma jets. Usually pure hydrogen with the addition of 0.1–5.0% $CH_4$ is used as the gas mixture, but other hydrocarbon gases can be used as the carbon source. In addition, the purity and quality of the diamond film can be controlled by adding other gases, for example oxygen-containing and noble gases.

The substrates of interest for diamond coatings in cutting tool or wear part applications include cemented carbides and ceramics such as SiAlON and $Si_3N_4$ and the deposition of diamond on these types of substrates is well-known in the art.

Cemented carbide coated with diamond is suitably depleted in the surface zone with respect to Co prior to the diamond coating. This can, for example, be obtained by partly carburizing an eta-phase containing body as disclosed in U.S. Ser. No. 08/214,157 (our reference: 024000-807).

The diamond layer can be applied as a single layer with a thickness in the range 1–20 $\mu$m or as a multilayer in which one or more diamond layers are combined with layers of other refractory materials.

For example, U.S. Pat. No. 4,734,339 (our reference: 024000-317) discloses a multilayer coating with at least two layers of which at least one is of diamond. In case of more than two layers of diamond, they are separated by non-diamond layers. Between the innermost diamond layer and the substrate there is a non-diamond layer, the purpose of which is to improve the adhesion between the diamond layer and the substrate. This intermediate layer is suitably a layer of metals that form stable carbides, e.g., metals from the group IVb to VIb of the periodic system, preferably Ti. The non-diamond layer can be carbides, nitrides, carbonitrides, oxycarbides, oxides and borides preferably of metals in group IVb to VIb of the periodic system and mixtures thereof.

U.S. Ser. No. 08/264,937 (our reference: 024444-046) discloses a body of cemented carbide, $Si_3N_4$ or another ceramic material, coated by at least one CVD or PVD diamond or cBN layer and a chromium-nitride, -carbide or -carbonitride layer. The chromium-containing layer is outside the diamond layer.

Swiss patent applications 03 267/93-6 and 03 268/93-8 disclose a diamond coated body with an enrichment of a metal or at least one of B, Si, Ge, S or P.

The edges of a cutting tool can be strengthened through the use of chip breakers, i.e., geometrical patterns of various kinds that affect the chip removal. In PCT/US91/05630, the application of such patterns for ceramic cutting tools (not coated) is described.

OBJECTS AND SUMMARY OF THE INVENTION

It is an object of this invention to avoid or alleviate the problems of the prior art.

It is further an object of this invention to provide a diamond coated cutting tool having an integral chip control surface.

In one aspect of the invention there is provided a compound body suitable for wear parts and tools applications, comprising a body of wear resistant material, said body including top and bottom surfaces and at least one peripheral wall extending therebetween, the intersection of said peripheral wall and at least said top surface forming cutting edge means and a surface coating on said body of a diamond coating layer of a thickness of 1–30 $\mu$m deposited directly from the gas phase in a reactor by CVD or PVD technique in a manner so as to ensure rigid bonding to said carbide substrate and wherein the top surface of said body is provided with an integral chipformer so as to provide chips formed during machining into a desired and controllable configuration.

BRIEF DESCRIPTION OF THE DRAWINGS

The invention will now be described in somewhat more detail in connection with the appended drawings, showing two embodiments of the invention.

FIG. 1 shows a side view of an insert of the invention.

FIG. 2 shows a top view of the insert in FIG. 1.

FIG. 3 shows a perspective view of the insert of FIGS. 1–2.

FIG. 4 shows a side view of another insert embodiment.

FIG. 5 shows a perspective view of the insert in FIG. 4.

DETAILED DESCRIPTION OF THE REFERRED EMBODIMENTS OF THE INVENTION

Figure 6:
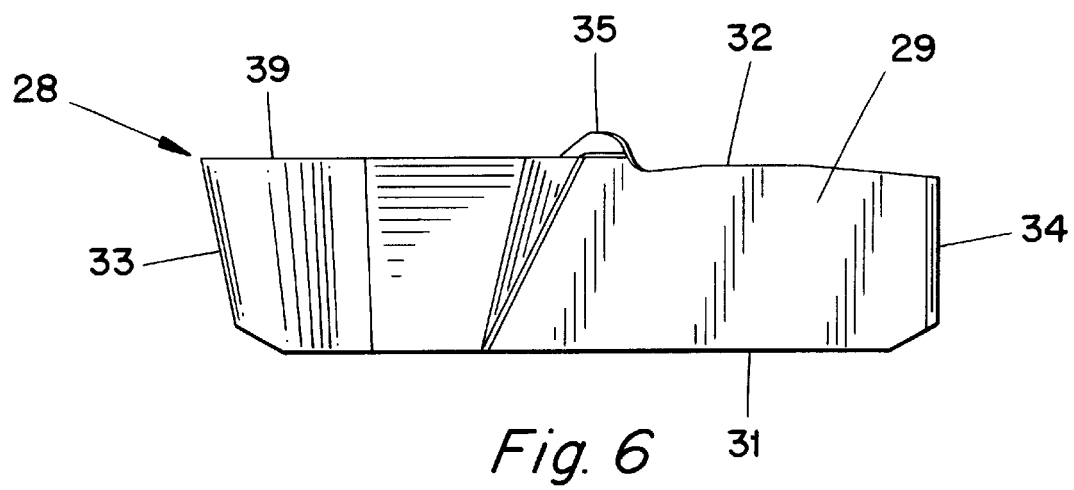
FIG. 6 shows another alternative embodiment in side view.

According to the presently claimed invention, there is now provided a diamond coated body for chipforming machining of metal workpieces, comprising opposed top and bottom surfaces and peripheral walls extending therebetween with at least one cutting edge being formed at the intersection between said peripheral wall and at least one of said top and bottom surfaces. At least said top surface is provided as a rake surface with an integral means for chip control thereon so as to provide chips formed during machining in a desired and controllable configuration.

In a preferred embodiment, a chip breaker groove is provided along the cutting edges in said top rake face, said groove being confined by a descending wall that slopes downwards from the cutting edge. The descending wall extends downwards until it joins a bottom floor on the said rake face, the bottom floor is composed of a number of ribs and intermediate valleys. At least such ribs and valleys should extend perpendicular to the line of the bisector at each corner region. Each of these ribs should have a smoothly rounded contour.

In an alternative round insert embodiment, a plurality of bumps is provided in a recessed portion of the top rake face. In this alternative embodiment, the chipbreaker groove in the rake face is in the shape of a descending wall that shapes downwardly in a direction away from said cutting edge until it reaches an upstanding wall of said bumps.

As a further alternative embodiment, said upper rake face is provided with a chipformer in the form of a descending wall that intersects with a single large projection that is confined by an upstanding wall intersecting with a flat top surface located below the plane of the cutting edge.

Due to the arrangement of such ribs, valleys or projections arranged inside of said descending wall, such insert will enable chipforming over wide ranges of depth of cut and feed.

The insert 10 according to FIGS. 1–2 comprises an insert body provided with cutting edges 11 formed by the intersection between the upper rake face or top surface 12 and the side surfaces or clearance face 13. The lower face 14 of the insert is mainly parallel to the top face 12. The insert 10 is rhombic in shape and intended for copy metalworking operations. The insert is provided with two diametrically opposed acute-angled corners. The cutting insert is provided with a centrally placed aperture 15 to receive a locking screw for mounting to a cutting insert site of a tool shank.

The insert 10 is along each cutting edge 11 provided with an adjacent chip groove that is sloping from the cutting edge. The chip groove is defined by a sloping flank 16, which extends downwards toward the central area of the insert. The central area of the insert has a lower attitude than compared with the cutting edges 11.

The cutting edges 11 slope from the cutting corner to the middle of the cutting edge of an angle $\alpha$, the inclination of which can be 10°–20°. The transition between the central portion 17 and the sloping flank 16 is a wave-shaped line and the surface portion 17 is composed of a number of raised ribs 18 and valleys 19 therebetween which extend perpendicularly towards the bisector of each cutting corner as shown in FIGS. 2–3.

In FIGS. 4–5 there is shown an alternative embodiment comprising a round insert 20. Similar to the embodiment of FIGS. 1–3, the chip groove adjacent to the cutting edge 21 is in the shape of a sloping flank 22. The insert has a positive geometry which means that the side surface 23 intersects the bottom face 24 at an obtuse angle while intersecting the top plane at an acute angle $\beta$, as shown in FIG. 4. The sloping flank 22 intersects with a plurality of curved projections 25 arranged adjacent each other annularly around the central aperture 26 so that the intersection line 27 between said sloping flank 22 and said projection 25 obtains a wave-shaped contour.

Figure 7:
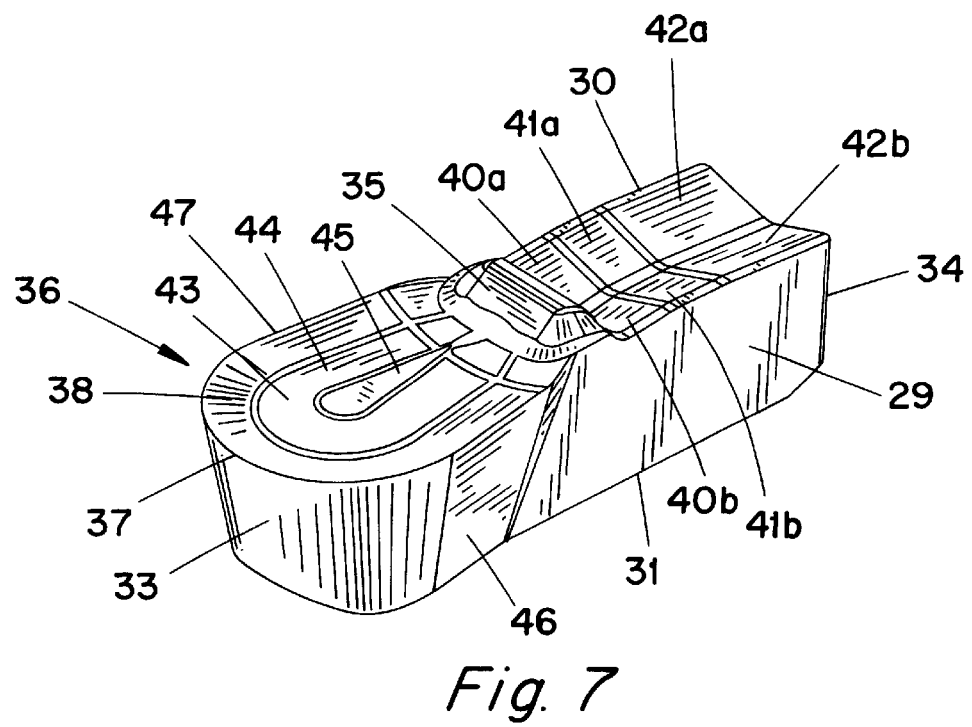
FIG. 7 shows a perspective view of the insert in FIG. 6.

The insert embodiment 28 of FIGS. 6–7 is especially tailored for parting and grooving operations and includes a body confined by two mainly plane-parallel side surfaces 29, 30, two edge surfaces 31, 32, two end surfaces 33, 34, a shoulder 35 and a portion 36 provided with a cutting edge and a chipforming device. The insert is secured to a holder body provided with an integral clamping arm. The clamping of the arm is described in U.S. Pat. No. 4,801,224 which is hereby incorporated by reference.

The cutting edge 37 is formed along the intersection line of the forward end surface 33 and a descending wall 38 which intersects at an acute angle. The upper surface of portion 36 provides a rake face 39. The upper surface of the rear portion of the insert is composed of pairs of longitudinally extending surfaces 40a and 40b, 41a and 41b and 42a and 42b. Each pair of surfaces intersect each other at obtuse angles so as to provide a V-shaped recess for the receipt of a correspondingly shaped clamp arm. Surfaces 40a and 40b slope forwardly, surfaces 41a and 41b extend parallel with bottom surface 31, and surfaces 42a and 42b slope rearwardly. The descending wall 38 extends inwardly until it intersects with an upwardly sloping wall 43 of a single elongated projection 44, the upper surface 45 of which is flat and does not extend above the plane of the cutting edge. The descending wall should intersect with forward end face 33 at an angle of 40°–65°, thus giving the insert a relatively high positive rake angle. The angle between descending wall 38 and the sloping wall 43 of the central projection 44 should be in the range of 140°–165°, preferably 140°–150°.

The side surfaces 46 and 47 of the forward portion insert portion 36 should be tapered rearwardly in order to provide sufficient clearance when engaging the insert 28 in parting and grooving operations.

The diamond coating can be applied by using any plasma CVD or PVD process such as hot filament or microwave assisted CVD, arc discharge plasma, gas flame or plasma jet methods. The thickness of the diamond layer is in the range 1–30 $\mu$m, preferably 4–20 $\mu$m. The diamond coating extends across at least the working surfaces of the insert including the cutting edge, rake face and chipbreaker portion of the insert and is deposited so as to ensure its rigid bonding to the substrate in accordance with any of the techniques known to the skilled artisan, and as disclosed in Swiss patent applications 03 267/93-6 and 03 268/93-8.

The bodies used for deposition according to the presently claimed invention include cemented carbides and ceramics such as SiAlON and $Si_3N_4$. Preferably, the cemented carbide body is depleted in the surface zone with respect to Co. This can, for example, be obtained by partly carburizing an eta-phase-containing body as disclosed in U.S. Ser. No. 08/216,157 (our reference: 024000-807).

An explanation for the improved performance of the machining properties of a diamond coated cutting tool according to the presently claimed invention may be favorable cutting forces during the machining operation due to the chipbreaker geometry.

The invention is additionally illustrated in connection with the following Examples which are to be considered as illustrative of the presently claimed invention. It should be understood, however, that the invention is not limited to the specific details of the Examples.

EXAMPLE 1

A cemented carbide insert, geometry CCGT 09T304-UM, composition 6 weight % Co and 94 weight % WC, was first heat treated in order to deplete the surface zone of Co. The insert was treated in an ultrasonic bath consisting of diamond powder suspended in alcohol. It was then subject to diamond deposition in a microwave plasma CVD reactor using the following deposition parameters:

Microwave power: 3000 W

Pressure: 70 torr $CH_4$ concentration: 4%

H flow rate: 800 sccm

Substrate temperature: 850° C.

Deposition time: 15 h

The insert was covered by a well-faceted diamond coating of thickness 10 $\mu$m on the rake face, in the chipbreaker grooves and in the region of the cutting edge while the coating thickness decreased gradually on going down the clearance faces. The grain size of the layer was about 10 $\mu$m on the rake face.

The insert was subjected to a turning test of an Al-18%Si alloy using the following cutting data:

v=1000 m/min f=0.3 mm/revolution a=1mm wet cutting

The diamond coated insert provided with the chipbreaker geometry lasted 60 minutes in this test compared to a planar, diamond coated insert (CCMW 09T304) without a chipbreaker, which lasted 44 minutes.

EXAMPLE 2

A cemented carbide insert provided with a chipbreaker geometry according to the presently claimed invention was used (VCGX 160412-AL) and was coated with a 6 μm thick diamond layer using arc discharge plasma CVD. The grain size of the layer was about 5 μm.

The insert was subjected to turning of components of an Al-M7%Si alloy using the cutting data:

v=1500 m/min f=0.25 mm/rev a=0.5 mm dry cutting

The surface finish of the workpiece after using the VCGX insert was $R_a$=1.8 while using a planar, diamond coated insert (VBMW 160412) resulted in $R_a$=2.3.

The principles, preferred embodiments and modes of operation of the presently claimed invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A cutting insert for the machining of Al-alloys comprising a compound body consisting of a sintered cemented carbide substrate with a surface coating, said body including top and bottom surfaces and at least on peripheral wall extending therebetween, the intersection of said peripheral wall and at least said top surface forming cutting edges, said top surface located below said cutting edges, said coating being a diamond coating with a thickness of 1–20 μm deposited directly from a gas phase in a reactor by CVD or PVD technique in a manner so as to ensure rigid bonding to said substrate, the top surface being provided with a plurality of curved projections and an integral chipformer so as to provide chips formed during machining into a desired and controllable configuration, the chipformer including a sloping flank that slopes away from said cutting edge and intersecting said plurality of curved projections, the intersection of said sloping flank and said plurality of curved projections including a wave-shaped line.

2. A cutting insert as defined in claim 1, wherein the insert is in the shape of a polygon and said bump is provided along a bisector in a corner region of said insert.

3. A cutting insert as defined in claim 2, wherein a plurality of elongated bumps extend perpendicularly to the bisector of the cutting corner and are symmetrically provided on both sides of the bisector in said corner region.

4. A cutting insert as defined in claim 1, wherein the body is circular and said plurality of curved projections includes a plurality of circular or semicircular projections that are arranged angularly around a central aperture of the insert.

5. A cutting insert as defined in claim 1, wherein the insert is rhombic in shape with two diametrically opposed acute angled corners and a central aperture and the cutting edges are sloping from the cutting corner to the middle of the cutting edge with an angle that amounts to 10°–20°.

* * * * *